(12) United States Patent
Yokoyama

(10) Patent No.: US 9,064,782 B2
(45) Date of Patent: Jun. 23, 2015

(54) WIRING STRUCTURE, DROPLET DISCHARGE HEAD, AND DROPLET DISCHARGE APPARATUS

(71) Applicant: Seiko Epson Corporation, Tokyo (JP)

(72) Inventor: Yoshihiko Yokoyama, Chino (JP)

(73) Assignee: SEIKO EPSON CORPORATION (JP)

( * ) Notice: Subject to any disclaimer, the term of this patent is extended or adjusted under 35 U.S.C. 154(b) by 0 days.

(21) Appl. No.: 14/165,667

(22) Filed: Jan. 28, 2014

(65) Prior Publication Data
US 2014/0210094 A1 Jul. 31, 2014

(30) Foreign Application Priority Data
Jan. 29, 2013 (JP) ................................. 2013-014041

(51) Int. Cl.
*H01L 23/48* (2006.01)
*H01L 23/00* (2006.01)
*H01L 51/00* (2006.01)

(52) U.S. Cl.
CPC ............. *H01L 24/17* (2013.01); *H01L 51/0005* (2013.01); *H01L 51/0004* (2013.01); *H01L 2924/07802* (2013.01)

(58) Field of Classification Search
CPC .. H01L 24/17; H01L 51/0005; H01L 51/0004
See application file for complete search history.

(56) References Cited

U.S. PATENT DOCUMENTS

| | | | |
|---|---|---|---|
| 6,616,270 B1 * | 9/2003 | Miyata et al. | 347/68 |
| 7,784,913 B2 * | 8/2010 | Yoda | 347/58 |
| 8,839,520 B2 * | 9/2014 | Yoda | 29/890.1 |
| 2006/0152548 A1 * | 7/2006 | Yasoshima et al. | 347/45 |
| 2006/0164468 A1 * | 7/2006 | Yoda | 347/71 |
| 2013/0037829 A1 * | 2/2013 | Chang et al. | 257/88 |
| 2013/0256667 A1 * | 10/2013 | Lee et al. | 257/59 |
| 2014/0054703 A1 * | 2/2014 | Feng et al. | 257/347 |

* cited by examiner

*Primary Examiner* — Nicholas Tobergte
(74) *Attorney, Agent, or Firm* — Harness, Dickey & Pierce, P.L.C.

(57) ABSTRACT

A droplet discharge head includes: a vibrating plate on which first and second terminals are formed; a reservoir forming substrate bonded to the vibrating plate and including a first inclined surface as a side surface on which a first wiring electrically connected to the first terminal is formed and that is inclined to a plate surface; and a wiring substrate bonded to the vibrating plate and including a second inclined surface as a side surface on which a second wiring electrically connected to the second terminal is formed and that is inclined to a plate surface along the first inclined surface.

11 Claims, 6 Drawing Sheets

WIRING STRUCTURE, DROPLET DISCHARGE HEAD, AND DROPLET DISCHARGE APPARATUS

BACKGROUND

1. Technical Field

The preset invention relates to a wiring structure, a droplet discharge head, and a droplet discharge apparatus.

2. Related Art

Droplet discharge apparatuses including a droplet discharge head that discharges a droplet are used for, for example, the formation of image or the manufacture of wiring of micro devices.

For example, a piezoelectrically-actuated droplet discharge head includes reservoirs that store ink, a plurality of pressure generating chambers in communication with the reservoirs, a plurality of nozzles respectively in communication with the plurality of pressure generating chambers, a plurality of piezoelectric elements that respectively vary the pressures in the plurality of pressure generating chambers, and a driver IC that drives the plurality of piezoelectric elements.

In the droplet discharge head, as disclosed in JP-A-2006-281763 (Patent Document 1), the piezoelectric elements and the reservoir forming substrate (wiring substrate) formed with the reservoirs are generally bonded to one surface of a channel forming substrate (base substrate) formed with the pressure generating chambers. The driver IC is bonded to a surface of the reservoir forming substrate opposite to the channel forming substrate, and electrically connected to the piezoelectric elements via wirings disposed on the reservoir forming substrate.

Between the driver IC and the piezoelectric elements, a step due to the thickness of the reservoir forming substrate is generated. The driver IC and the piezoelectric elements need to be electrically connected via the step.

Therefore, in the droplet discharge head disclosed in Patent Document 1, a side surface of the reservoir forming substrate is formed to be an inclined surface. On the inclined surface, the wirings that electrically connect the driver IC with the piezoelectric elements are formed.

In recent years, it is desired for realizing the formation of image or the manufacture of wiring with higher definition to reduce the pitch between the nozzles. As the pitch between the nozzles is reduced, the pitch between terminals of the piezoelectric elements is also reduced.

In the droplet discharge head disclosed in Patent Document 1, however, since a surface on which the wirings are formed is one side surface of the reservoir forming substrate, the minimum pitch between the wirings is about the same as that between the terminals of the piezoelectric elements. Therefore, when the pitch between the terminals of the piezoelectric elements is reduced, there arises a problem that the formation of wiring is difficult.

SUMMARY

An advantage of some aspects of the invention is to provide: a wiring structure including a plurality of terminals formed on a base substrate and a plurality of wirings formed on a wiring substrate bonded to the base substrate, the plurality of terminals and the plurality of wirings being electrically connected, in which even when a pitch between the plurality of terminals is reduced, the wirings can be easily formed; and a droplet discharge head and a droplet discharge apparatus both including the wiring structure.

A wiring structure according to an aspect of the invention includes: a base substrate on which a first terminal and a second terminal are formed; a first wiring substrate bonded to the base substrate and including a first inclined surface on which a first wiring electrically connected to the first terminal is formed and that is at an acute angle to the base substrate; and a second wiring substrate bonded to the base substrate and including a second inclined surface on which a second wiring electrically connected to the second terminal is formed and that is inclined to the base substrate along the first inclined surface.

According to the wiring structure, since the first wiring and the second wiring are formed on separate inclined surfaces, each of a pitch between the first wirings and a pitch between the second wirings can be made greater than a pitch between the first terminal and the second terminal. Therefore, even when the pitch between the first terminal and the second terminal is reduced, each of the first wiring and the second wiring can be easily formed.

In the wiring structure according to the aspect of the invention, it is preferable that a third terminal electrically connected to the first wiring and a fourth terminal electrically connected to the second wiring are formed on a surface of the first wiring substrate opposite to the base substrate.

With this configuration, a semiconductor device or an IC package arranged on the first wiring substrate can be electrically connected easily with the third terminal and the fourth terminal.

In the wiring structure according to the aspect of the invention, it is preferable that the second wiring and the fourth terminal are bonded together via a conductive bump.

With this configuration, an electrical connection between the second wiring and the fourth terminal can be performed easily and reliably. Moreover, since the gap between the first wiring and the second wiring can be increased, a short circuit between the first wiring and the second wiring can be prevented. As a result, the reliability of the wiring structure can be increased.

In the wiring structure according to the aspect of the invention, it is preferable that a plurality of the third terminals and a plurality of the fourth terminals are alternately arranged in parallel.

With this configuration, the pitch between the first wirings and the pitch between the second wirings can be increased, and as a result, the first wiring and the second wiring can be easily formed.

In the wiring structure according to the aspect of the invention, it is preferable that the second wiring extends from the second inclined surface to a surface of the second wiring substrate on the base substrate side.

With this configuration, the second terminal and the second wiring can be bonded together between the base substrate and the second wiring substrate. Therefore, an electrical connection between the second terminal and the second wiring is easily made.

In the wiring structure according to the aspect of the invention, it is preferable that the second wiring and the second terminal are bonded together via a conductive bump.

With this configuration, an electrical connection between the second wiring and the second terminal can be performed easily and reliably. Moreover, since the gap between the second wiring and the first terminal can be increased, a short circuit between the second wiring and the first terminal can be prevented. As a result, the reliability of the wiring structure can be increased.

In the wiring structure according to the aspect of the invention, it is preferable that the first inclined surface and the second inclined surface are bonded together via an insulating adhesive.

With this configuration, the first wiring substrate and the second wiring substrate are bonded together, and the mechanical strength of the wiring structure can be improved. Moreover, since an insulating adhesive can be present between the first wiring and the second wiring, a short circuit between the second wiring and the second terminal can be prevented. As a result, the reliability of the wiring structure can be increased.

In the wiring structure according to the aspect of the invention, it is preferable that each of the first wiring substrate and the second wiring substrate is bonded to the base substrate via an insulating adhesive.

With this configuration, the base substrate, and the first wiring substrate and the second wiring substrate are bonded together, and the mechanical strength of the wiring structure can be improved. Moreover, since an insulating adhesive can be present between the first wiring and the second terminal and between the second wiring and the first terminal, a short circuit between the wiring and the terminal can be prevented. As a result, the reliability of the wiring structure can be increased.

In the wiring structure according to the aspect of the invention, it is preferable that each of the first wiring substrate and the second wiring substrate is composed of silicon, and that each of the first inclined surface and the second inclined surface is formed along a crystal plane of silicon.

With this configuration, the first inclined surface and the second inclined surface can be formed with high dimensional accuracy. As a result, an electrical connection at a desired site can be made more reliably and easily. Also, a short circuit between unexpected sites is prevented, so that the reliability of the wiring structure can be increased.

A droplet discharge head according to an aspect of the invention includes the wiring structure according to the aspect of the invention.

According to the droplet discharge head, a pitch between a plurality of nozzles that discharge droplets can be easily narrowed.

A droplet discharge apparatus according to an aspect of the invention includes the droplet discharge head according to the aspect of the invention.

According to the droplet discharge apparatus, droplet discharge with high definition can be realized.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a wiring structure, a droplet discharge head, and a droplet discharge apparatus according to the invention will be described in detail based on a preferred embodiment shown in the accompanying drawings.

Figure 1:
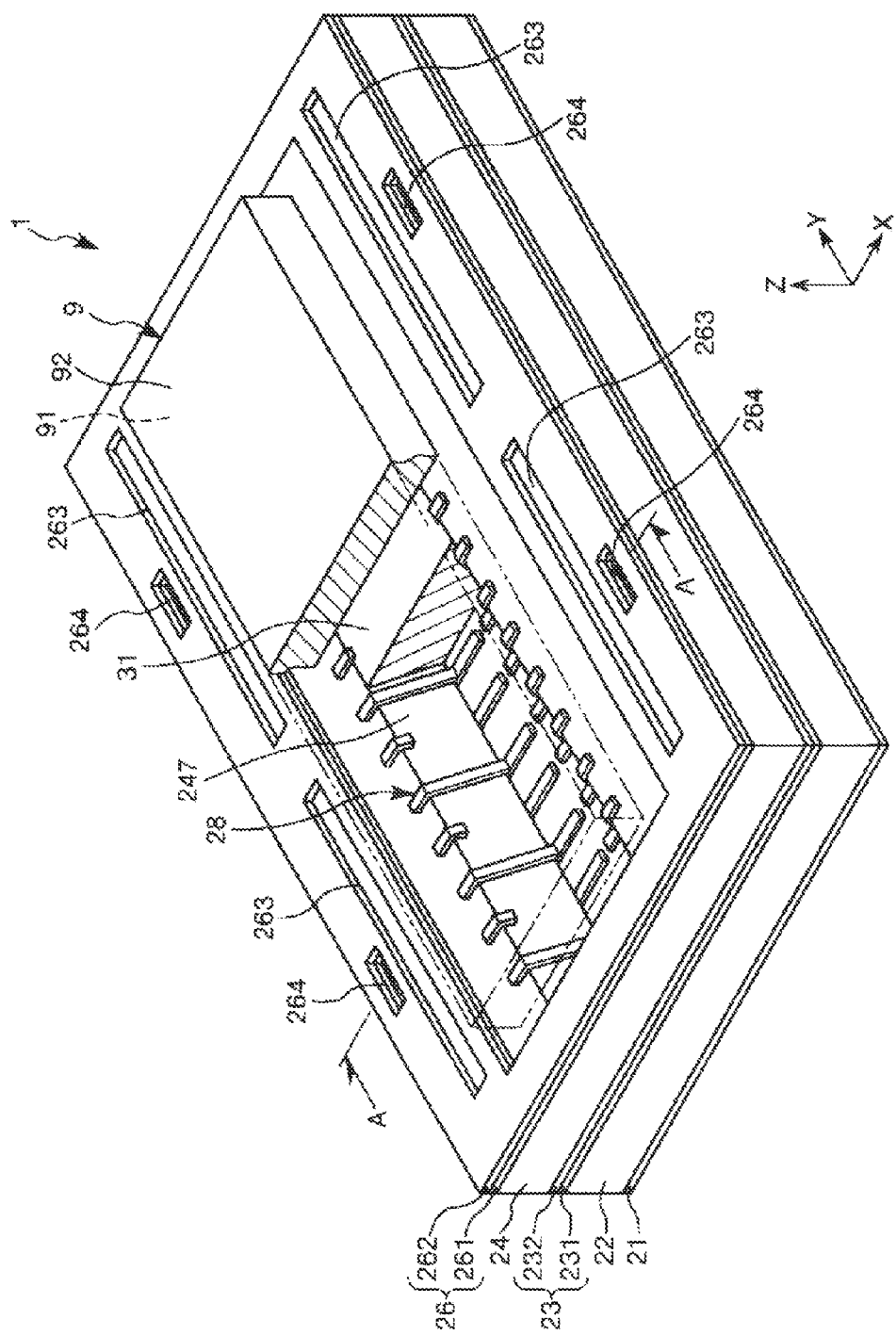
FIG. 1 is a perspective view showing a droplet discharge head (wiring structure) according to an embodiment of the invention.
Figure 2:
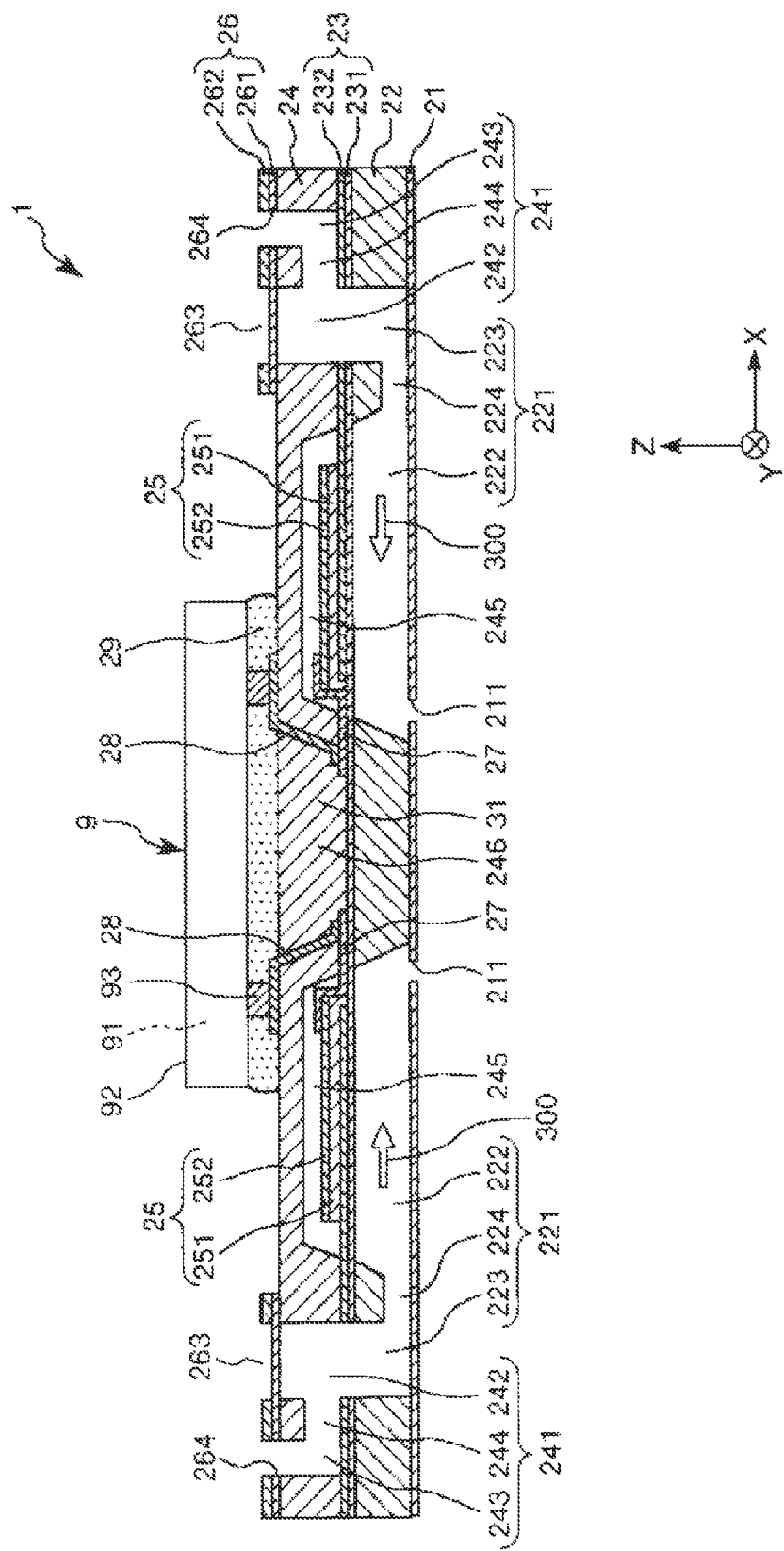
FIG. 2 is a cross-sectional view taken along line A-A in FIG. 1.
Figure 3A:
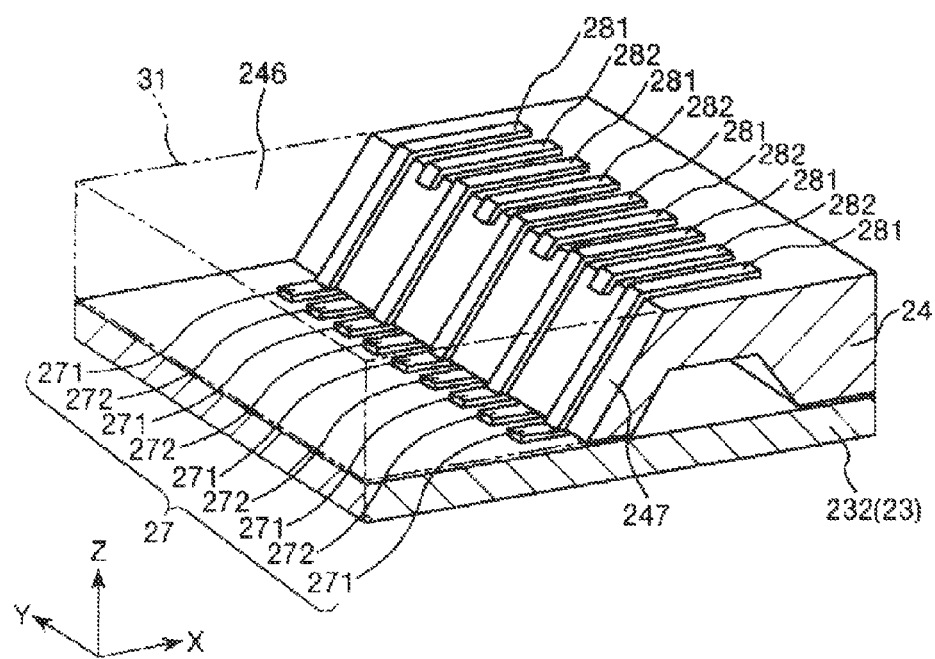
FIGS. 3A and 3B explain a base substrate, a first wiring substrate, and a second wiring substrate of the droplet discharge head shown in FIG. 1.
Figure 3B:
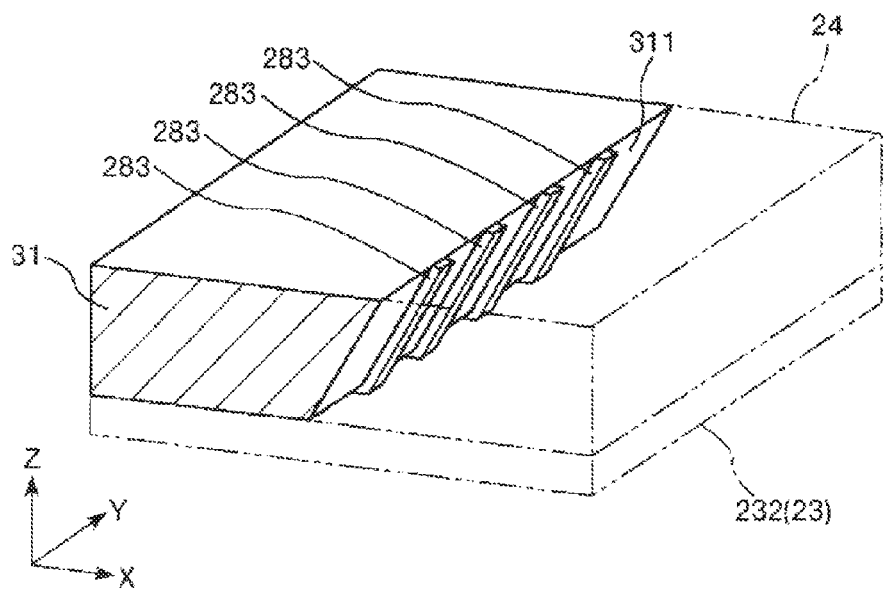
Figure 4:
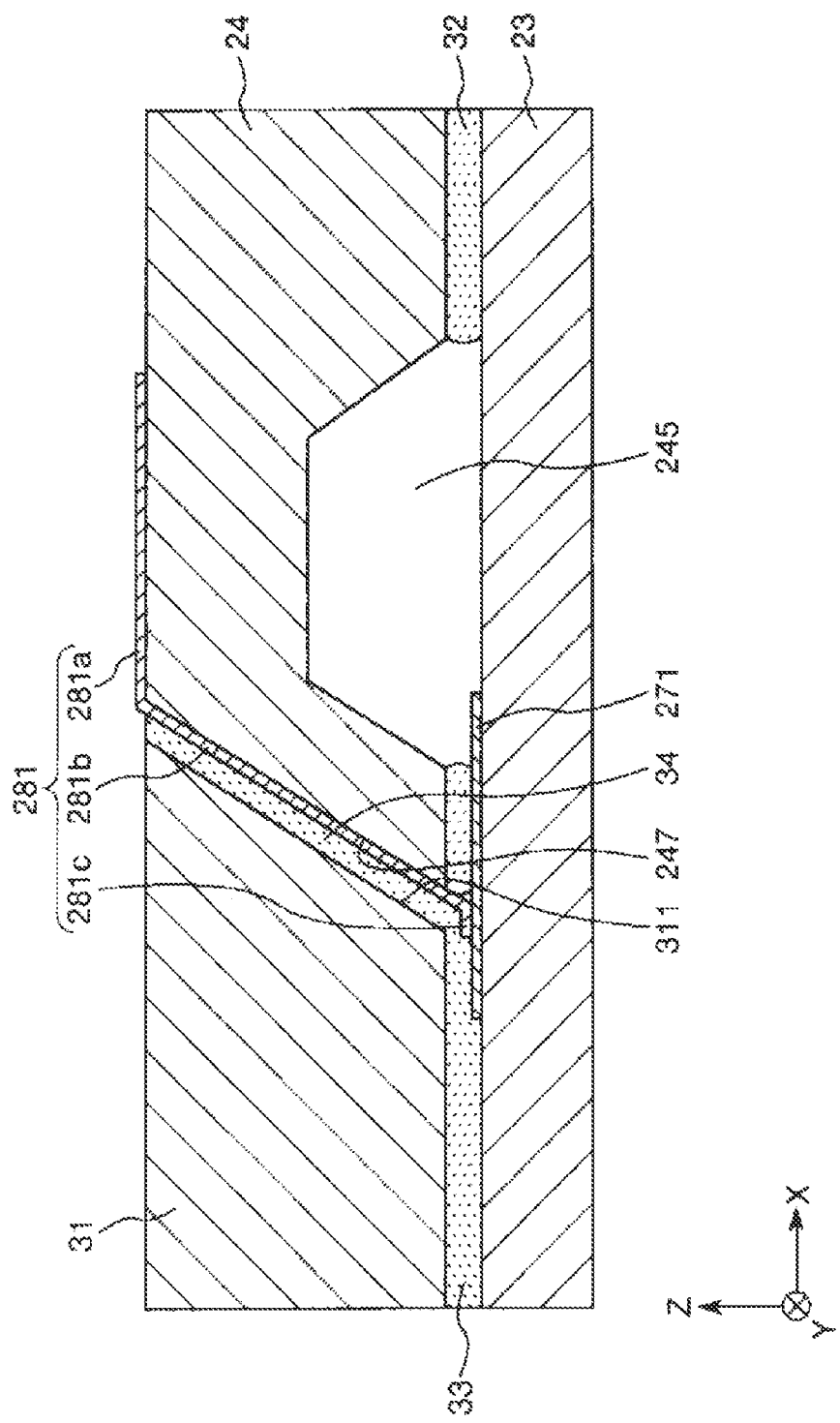
FIG. 4 is a cross-sectional view for explaining a first terminal of the base substrate and a first wiring and a third terminal of the first wiring substrate shown in FIG. 2.
Figure 5:
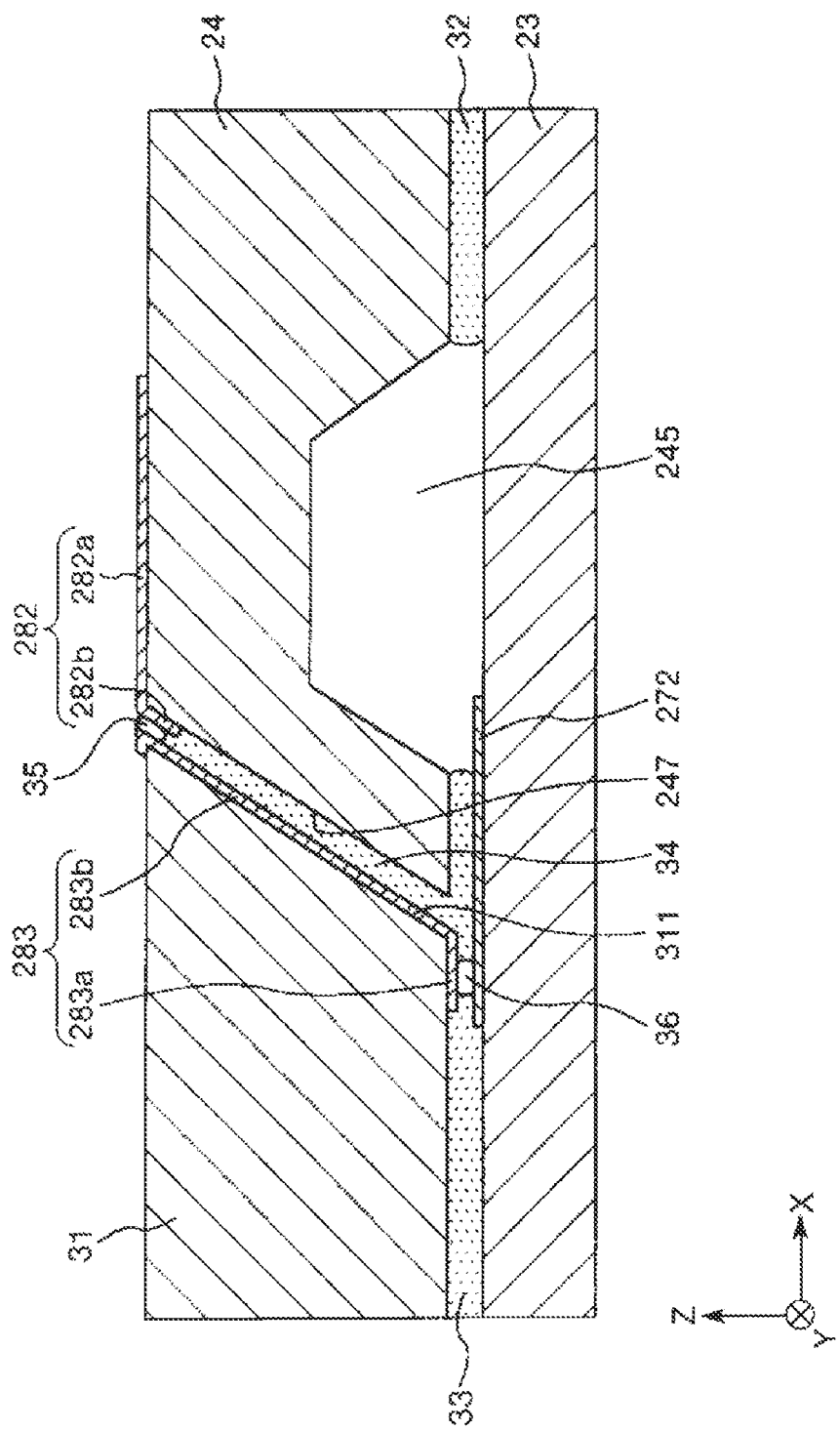
FIG. 5 is a cross-sectional view for explaining a second terminal of the base substrate, a fourth terminal of the first wiring substrate, and a second wiring of the second wiring substrate shown in FIG. 2.

FIG. 1 is a perspective view showing the droplet discharge head (wiring structure) according to the embodiment of the invention. FIG. 2 is a cross-sectional view taken along line A-A in FIG. 1. FIGS. 3A and 3B explain a base substrate, a first wiring substrate, and a second wiring substrate of the droplet discharge head shown in FIG. 1. FIG. 4 is a cross-sectional view for explaining a first terminal of the base substrate and a first wiring and a third terminal of the first wiring substrate shown in FIG. 2. FIG. 5 is a cross-sectional view for explaining a second terminal of the base substrate, a fourth terminal of the first wiring substrate, and a second wiring of the second wiring substrate shown in FIG. 2.

In FIGS. 1 to 5, for convenience of description, an X-axis, a Y-axis, and a Z-axis are illustrated as three axes orthogonal to each other. The tip side of each of the illustrated arrows is defined as "positive", while the base end side is defined as "negative". In the following description, a direction parallel to the X-axis is referred to as "X-axis direction"; a direction parallel to the Y-axis is referred to as "Y-axis direction"; and a direction parallel to the Z-axis is referred to as "Z-axis direction". Moreover, the positive Z-axis side is also referred to as "upper", while the negative Z-axis side is also referred to as "lower".

A droplet discharge head 1 shown in FIGS. 1 and 2 is mounted for use on, for example, a droplet discharge apparatus 100 (printing apparatus) described later.

The droplet discharge head 1 includes a nozzle substrate 21 (nozzle plate), a channel forming substrate 22, a vibrating plate 23, a reservoir forming substrate 24 (first wiring substrate), a plurality of piezoelectric elements 25, a compliance substrate 26, a wiring substrate 31 (second wiring substrate), and an integrated circuit (IC) package 9.

The nozzle substrate 21, the channel forming substrate 22, the vibrating plate 23, the reservoir forming substrate 24, and the compliance substrate 26 are stacked in this order. These substrates are bonded such that two of the substrates next to each other are bonded together with, for example, an adhesive, a heat sealing film, or the like.

In the droplet discharge head 1, each of the piezoelectric elements 25 causes the vibrating plate 23 to vibrate. Therefore, the pressure in a pressure generating chamber 222 of each of channels 221 formed in the channel forming substrate 22 is varied, so that ink 300 is discharged as a droplet through each of discharge ports 211 formed in the nozzle substrate 21.

Hereinafter, each portion of the droplet discharge head 1 will be sequentially described in detail.

Nozzle Substrate

As shown in FIG. 2, in the nozzle substrate 21, a plurality of the discharge ports 211 (nozzles) that penetrate the nozzle substrate 21 in its thickness direction are formed. In the embodiment, the plurality of discharge ports 211 are arranged in a matrix. More specifically, the nozzle substrate 21 has an elongated shape with its longitudinal direction being in the Y-axis direction. The plurality of discharge ports 211 are arranged in n rows (n is an integer of 1 or more) in the longitudinal direction (Y-axis direction) of the nozzle substrate 21 and in two columns in its width direction (X-axis direction).

The constituent material of the nozzle substrate 21 is not particularly limited, and for example, preferably a silicon material or stainless steel. Such a material is excellent in chemical resistance. Therefore, even when the nozzle substrate 21 is exposed to the ink 300 over along time, the deterioration or degradation of the nozzle substrate 21 can be reliably prevented. Moreover, since such a material is excellent in workability, the nozzle substrate 21 with high dimensional accuracy is obtained. For this reason, the droplet discharge head 1 with high reliability is obtained.

Moreover, the nozzle substrate 21 can be obtained by, for example, forming the discharge ports 211 by etching, laser processing, or the like in a substrate composed of the material described above.

Channel Forming Substrate

The channels 221 through each of which the ink 300 passes toward the discharge port 211 are formed in the channel forming substrate 22. As shown in FIG. 2, the channels 221 include a plurality of the pressure generating chambers 222, relay chambers 223 (communication portions), and a plurality of communication paths 224 (supply paths) that respectively communicate the plurality of pressure generating chambers 222 with the relay chambers 223.

The plurality of pressure generating chambers 222 are disposed respectively corresponding to the plurality of discharge ports 211. In the embodiment, the plurality of pressure generating chambers 222 are arranged, respectively corresponding to the plurality of discharge ports 211, in n rows (n is an integer of 1 or more) in the Y-axis direction and in two columns in the X-axis direction.

The relay chamber 223 is disposed on the upstream side of the pressure generating chamber 222 in a flowing direction of the ink 300.

The communication path 224 is disposed between the pressure generating chamber 222 and the relay chamber 223.

The constituent material of the channel forming substrate 22 is not particularly limited, and for example, the same constituent material as that of the nozzle substrate 21 can be used.

Moreover, the channel forming substrate 22 can be obtained by, for example, forming the channels 221 by etching in a substrate composed of the material described above.

Vibrating Plate

The vibrating plate 23 is configured to be able to vibrate in its thickness direction. A portion of the vibrating plate 23 faces the pressure generating chamber 222. That is, the portion of the vibrating plate 23 constitutes a portion of a wall that defines and forms the pressure generating chamber 222. With this configuration, the vibrating plate 23 vibrates, and therefore, the pressure in the pressure generating chamber 222 varies, so that the ink 300 can be discharged as a droplet from the pressure generating chamber 222 through the discharge port 211.

The vibrating plate 23 is composed of an elastic film 231 and a lower electrode film 232 stacked in this order from the channel forming substrate 22 side.

The elastic film 231 is composed of a silicon oxide film having a thickness of, for example, about 1 to 2 μm. The lower electrode film 232 is composed of a metal film having a thickness of, for example, about 0.2 μm. The lower electrode film 232 functions also as a common electrode of the plurality of piezoelectric elements 25.

Reservoir Forming Substrate

In the reservoir forming substrate 24, reservoirs 241 that temporarily store the ink 300 are formed respectively in communication with a plurality of the channels 221 of the channel forming substrate 22. As shown in FIG. 2, the reservoir 241 includes a first chamber 242 (reservoir portion), a second chamber 243 (introduction path), and a communication path 244 that communicates the first chamber 242 with the second chamber 243.

The first chamber 242 is in communication with the relay chamber 223 of the channel 221 of the channel forming substrate 22. The vibrating plate 23 is eliminated between the first chamber 242 and the relay chamber 223. With this configuration, the first chamber 242 and the relay chamber 223 are in communication with each other.

The second chamber 243 is disposed on the upstream side of the first chamber 242 in the flowing direction of the ink 300.

The communication path 244 is disposed between the first chamber 242 and the second chamber 243.

In the droplet discharge head 1, it can be said that the relay chamber 223 constitutes a portion of the reservoir 241.

In the reservoir forming substrate 24, piezoelectric element accommodating chambers 245 that accommodate the plurality of piezoelectric elements 25 are formed. The piezoelectric element accommodating chamber 245 is formed independently of the reservoir 241.

In the reservoir forming substrate 24, a through portion 246 that penetrates the reservoir forming substrate 24 in its thickness direction is formed. A wiring substrate 31 described later is inserted in the through portion 246.

An inner wall surface of the through portion 246 is inclined to a plate surface of the reservoir forming substrate 24, and constitutes an inclined surface 247 (first inclined surface) at an acute angle to the vibrating plate 23. On the inclined surface 247 and in the vicinity thereof, a plurality of belt-like wirings 281 and a plurality of wirings 282 are formed (refer to FIG. 3A). The plurality of wirings 281 and 282 and a plurality of wirings 283 of the wiring substrate 31 described later constitute a wiring pattern 28.

The inclined surface 247 and the plurality of wirings 281 and 282 will be described in detail later together with the description of the wiring substrate 31 described later.

An insulating film is formed on a surface (surface on which at least the wirings 281 and 282 are formed) of the reservoir forming substrate 24. For example, when the reservoir forming substrate 24 is composed of silicon, a silicon oxide film can be formed as an insulating film by thermal oxidation. With the formation of the insulating film, a short circuit between the wirings 281 and 282 can be prevented.

Piezoelectric Element

The plurality of piezoelectric elements 25 are arranged between the channel forming substrate 22 and the reservoir forming substrate 24. The plurality of piezoelectric elements 25 are disposed respectively corresponding to the plurality of discharge ports 211 and the plurality of pressure generating chambers 222.

Each of the piezoelectric elements 25 is composed of a piezoelectric film 251 and an upper electrode film 252 stacked in this order from the lower electrode film 232 side. As described above, since the lower electrode film 232 functions also as the common electrode of the plurality of piezoelectric elements 25, it can be said that the plurality of piezoelectric elements 25 are composed of the lower electrode film 232, a plurality of the piezoelectric films 251, and a plurality of the upper electrode films 252.

A terminal 27 is electrically connected to each of the upper electrode films 252. The terminal 27 extends from over the upper electrode film 252 to over the elastic film 231 of the vibrating plate 23 across a side surface of the piezoelectric film 251. An end of the terminal 27 opposite to the upper electrode film 252 faces the through portion 246 of the reservoir forming substrate 24.

The terminal 27 will be described in detail later together with the description of the wiring substrate 31 described later.

In each of the piezoelectric elements 25, a voltage is applied between the upper electrode film 252 and the lower electrode film 232, so that the piezoelectric film 251 is deformed by a piezoelectric effect. With this deformation, the vibrating plate 23 can be vibrated in the thickness direction.

Compliance Substrate

The compliance substrate 26 is composed of a sealing film 261 and a fixing plate 262 stacked in this order from the reservoir forming substrate 24 side.

The sealing film 261 is composed of a material having flexibility (for example, a polyphenylene sulfide film having a thickness of about 6 μm). A portion of the sealing film 261 faces the reservoir 241. The fixing plate 262 is composed of a relatively hard material such as a metal material (for example, stainless steel having a thickness of about 30 μm). In the fixing plate 262, eliminated portions 263 at each of which an area of the fixing plate 262 corresponding to the portion of the sealing film 261 facing the reservoir 241 is eliminated are formed.

In the compliance substrate 26, introduction ports 264 that collectively penetrate the sealing film 261 and the fixing plate 262 are formed. The introduction port 264 is in communication with the reservoir 241, and is a portion that introduces the ink 300 to the reservoir 241.

Wiring Substrate

The wiring substrate 31 is composed of a member different from the reservoir forming substrate 24, and arranged in the through portion 246 of the reservoir forming substrate 24. In the embodiment, the wiring substrate 31 has a shape conforming or similar to that of the through portion 246. With this configuration, the wiring substrate 31 can be embedded in the space in the through portion 246. Moreover, a surface of the wiring substrate 31 opposite to the vibrating plate 23 and the surface of the reservoir forming substrate 24 opposite to the vibrating plate 23 can be arranged along the same plane. Therefore, the IC package 9 can be stably supported by the wiring substrate 31 and the reservoir forming substrate 24.

As shown in FIG. 3B, the wiring substrate 31 includes an inclined surface 311 (second inclined surface) that is a side surface of the wiring substrate 31 and inclined to its plate surface and the vibrating plate 23 along the inclined surface 247 of the reservoir forming substrate 24.

On the inclined surface 311 and in the vicinity thereof, the plurality of belt-like wirings 283 (second wirings) are formed.

As described above, the plurality of wirings 281 and 282 of the reservoir forming substrate 24 and the plurality of wirings 283 constitute the wiring pattern 28 that electrically connects a plurality of the terminals 27 with the IC package 9.

Hereinafter, the wiring pattern 28 will be described in detail based on FIGS. 3A to 5. In FIGS. 3A to 5, an illustration of the piezoelectric element 25 is omitted for convenience of description.

The wiring pattern 28 is composed of the plurality of wirings 281 and 282 formed on the reservoir forming substrate 24 as shown in FIG. 3A and the plurality of wirings 283 formed on the wiring substrate 31 as shown in FIG. 3B.

As shown in FIG. 3A, the plurality of wirings 281 and 282 are arranged such that the wirings 281 and the wirings 282 are alternately arranged in parallel in the Y-axis direction. In the illustration, a gap between the wiring 281 and the wiring 282 is constant over the entire area in its length direction. However, the gap is determined depending on a pitch of the plurality of terminals 27 and a pitch of a plurality of terminals 93 of the IC package 9. When the pitch of the plurality of terminals 93 of the IC package 9 is greater than that of the plurality of terminals 27, the gap has a portion that becomes wider from the lower side toward the upper side.

The plurality of wirings 281 are disposed respectively corresponding to a plurality of terminals 271 (first terminals) that are alternately arranged terminals of the plurality of terminals 27 electrically connected to the plurality of piezoelectric elements 25. Each of the wirings 281 is electrically connected to the corresponding terminal 271.

As shown in FIG. 4, each of the wirings 281 includes a terminal portion 281a formed on the upper surface (surface opposite to the vibrating plate 23) of the reservoir forming substrate 24, a wiring portion 281b formed on the inclined surface 247, and a connecting portion 281c formed on the terminal 271. That is, each of the wirings 281 extends from over the upper surface of the reservoir forming substrate 24 to over the terminal 27 across the inclined surface 247.

Each of the wirings 281 or the wiring portions 281b constitutes a first wiring formed on the inclined surface 247 as the first inclined surface. The terminal portion 281a constitutes a third terminal electrically connected to the wiring 281 or the wiring portion 281b as the first wiring. The plurality of terminals 271 constitute the first terminals formed on the vibrating plate 23 as the base substrate, or the elastic film 231. A plurality of terminals 272 that are other terminals of the plurality of terminals 27 than the plurality of terminals 271 constitute second terminals formed on the vibrating plate 23 as the base substrate, or the elastic film 231.

On the other hand, the plurality of wirings 282 are disposed respectively corresponding to the plurality of terminals 272 (second terminals) that are other terminals of the plurality of terminals 27 than the plurality of terminals 271 where the plurality of terminals 27 are electrically connected to the plurality of piezoelectric elements 25. Each of the wirings 282 is electrically connected to the corresponding terminal 272.

As shown in FIG. 5, each of the wirings 282 includes a terminal portion 282a formed on the upper surface (surface opposite to the vibrating plate 23) of the reservoir forming substrate 24 and a connecting portion 282b formed at an upper edge portion of the inclined surface 247. That is, each of the wirings 282 extends from over the upper surface of the reservoir forming substrate 24 to over the upper edge portion of the inclined surface 247.

The wiring 282 or the terminal portion 282a constitutes a fourth terminal electrically connected to the wiring 283 as the second wiring.

The inclined surface 247 is oriented to the upper surface side of the reservoir forming substrate 24, and the plurality of wirings 281 and the plurality of wirings 282 are disposed on the upwardly oriented surfaces (the upper surface and the inclined surface 247) of the reservoir forming substrate 24. Therefore, the plurality of wirings 281 and the plurality of wirings 282 can be easily formed from the surface sides using vapor deposition.

As shown in FIG. 3B, the plurality of wirings 283 are arranged in parallel in the Y-axis direction. In the illustration, a gap between the wirings 283 is constant over the entire area in its length direction. However, the gap is determined depending on the pitch of the plurality of terminals 27 and the pitch of the plurality of terminals 93 of the IC package 9. Therefore, when the pitch of the plurality of terminals 93 of the IC package 9 is greater than that of the plurality of terminals 27, the gap has a portion that becomes wider from the lower side toward the upper side.

Each of the wirings 283 is arranged so as to be positioned between the plurality of wirings 281 when viewed from a direction perpendicular to the inclined surface 311. That is, the plurality of wirings 283 are arranged so as not to overlap the wirings 281 when viewed from the direction perpendicular to the inclined surface 311. With this configuration, a distance between the wiring 281 and the wiring 283 is increased, so that a short circuit between the wiring 281 and the wiring 283 can be prevented.

The plurality of wirings 283 are disposed respectively corresponding to the plurality of terminals 272 that are other terminals of the plurality of terminals 27 than the plurality of terminals 271 where the plurality of terminals 27 are electrically connected to the plurality of piezoelectric elements 25. That is, the plurality of wirings 283 are disposed respectively corresponding to the plurality of wirings 282. Each of the wirings 283 is electrically connected to the corresponding terminal 272 and the corresponding wiring 282.

As shown in FIG. 5, each of the wirings 283 includes a connecting portion 283a formed on a lower surface of the wiring substrate 31 and a wiring portion 283b formed on the inclined surface 311. That is, each of the wirings 283 extends from over the lower surface of the wiring substrate 31 to over an upper edge portion of the inclined surface 311.

The wiring 283 or the wiring portion 283b constitutes the second wiring formed on the inclined surface 311 as the second inclined surface.

The inclined surface 311 is oriented to the lower surface side of the wiring substrate 31, and the plurality of wirings 283 are disposed on the downwardly oriented surfaces (the lower surface and the inclined surface 311) of the wiring substrate 31. Therefore, the plurality of wirings 283 can be easily formed from the surface sides using vapor deposition.

According to a wiring structure including the wiring pattern 28, since the plurality of wirings 281 and the plurality of wirings 283 are formed on separate inclined surfaces, each of the pitch between the plurality of wirings 281 and the pitch between the plurality of wirings 283 can be made greater than that between the plurality of terminals 27 (the pitch between the terminal 271 and the terminal 272). Therefore, even when the pitch between the plurality of terminals 27 is reduced, the plurality of wirings 281 and the plurality of wirings 283 can be respectively formed easily.

The terminal portion 281a electrically connected to the wiring 281 and the terminal portion 282a electrically connected to the wiring 283 are formed on the surface of the reservoir forming substrate 24 opposite to the vibrating plate 23. Therefore, the IC package 9 arranged on the reservoir forming substrate 24 and the plurality of terminals 27 can be electrically connected easily via the wirings 281 and 283.

In the embodiment, the wiring 283 and the connecting portion 282b of the wiring 282 are bonded together via a conductive bump 35. With this configuration, an electrical connection between the wiring 283 and the wiring 282 can be performed easily and reliably. Moreover, since a gap between the wiring 281 and the wiring 283 can be increased due to the height of the bump 35, a short circuit between the wiring 281 and the wiring 283 can be prevented. As a result, the reliability of the wiring pattern 28 (wiring structure) can be increased.

The constituent material of the bump 35 is not particularly limited, and for example, various kinds of brazing materials (solders) such as tin-lead-based, tin-silver-based, tin-zinc-based, tin-bismuth-based, tin-antimony-based, tin-silver-bismuth-based, tin-copper-based, and tin-silver-copper-based materials can be used.

Since a plurality of the terminal portions 281a and a plurality of the terminal portions 282a are alternately arranged in parallel, the pitch between the wirings 281 and the pitch between the wirings 283 are increased. As a result, the wirings 281 and the wirings 283 can be easily formed.

As described above, the wiring 283 includes the connecting portion 283a. That is, the wiring 283 extends from the inclined surface 311 to the surface of the wiring substrate 31 on the vibrating plate 23 side. With this configuration, the terminal 272 and the wiring 283 can be bonded together between the vibrating plate 23 and the wiring substrate 31. Therefore, an electrical connection between the terminal 272 and the wiring 283 is easily made.

In the embodiment, the wiring 283 and the terminal 272 are bonded together via a conductive bump 36 as shown in FIG. 5. With this configuration, the electrical connection between the wiring 283 and the terminal 272 can be performed easily and reliably. Moreover, since a gap between the wiring 283 and the terminal 271 can be increased due to the height of the bump 36, a short circuit between the wiring 283 and the terminal 271 can be prevented. As a result, the reliability of the wiring pattern 28 (wiring structure) can be increased.

The constituent material of the bump 36 is not particularly limited, and for example, the same constituent material as that of the bump 35 can be used.

The inclined surface 247 and the inclined surface 311 are bonded together via an insulating adhesive 34. With this configuration, the reservoir forming substrate 24 and the wiring substrate 31 are bonded together, and the mechanical strength of the wiring structure in which these substrates are bonded together can be improved. Moreover, since the insulating adhesive 34 can be present between the wiring 281 and the wiring 283, a short circuit between the wiring 283 and the wiring 281 can be prevented. As a result, the reliability of the wiring structure can be increased.

The constituent material of the adhesive 34 is not particularly limited as long as the material has an adhesive property capable of bonding the inclined surface 247 and the inclined surface 311 together. For example, a resin composition including a resin material (particularly a curable resin) can be used. The resin composition may include an insulating filler.

The reservoir forming substrate 24 is bonded to the vibrating plate 23 via an insulating adhesive 32, while the wiring substrate 31 is bonded to the vibrating plate 23 via an insulating adhesive 33. With this configuration, the vibrating plate 23, and the reservoir forming substrate 24 and the wiring substrate 31 are bonded together, and the mechanical strength of the wiring structure can be improved. Moreover, since the insulating adhesive 32 or 33 can be present between the wiring 281 and the terminal 272 and between the wiring 283 and the terminal 271, a short circuit between the wiring and the terminal can be prevented. As a result, the reliability of the wiring structure can be increased.

The constituent material of the adhesives 32 and 33 is not particularly limited, and for example, the same constituent material as that of the adhesive 34 can be used.

The width of the through portion 246 of the reservoir forming substrate 24 is increased from the lower side toward the upper side. Therefore, the reservoir forming substrate 24 and the vibrating plate 23 are bonded together with the adhesive 32 before the wiring substrate 31 and the vibrating plate 23 are bonded together with the adhesive 33. Alternatively, after the reservoir forming substrate 24 and the wiring substrate 31 are bonded together with the adhesive 34, the reservoir forming substrate 24 and the vibrating plate 23 are bonded together with the adhesive 32 simultaneously when the wiring substrate 31 and the vibrating plate 23 are bonded together with the adhesive 33. When the reservoir forming substrate 24 and the wiring substrate 31 are bonded together with the adhesive 34, the wiring 282 and the wiring 283 are simultaneously connected with the bump 35. Moreover, when the wiring substrate 31 and the vibrating plate 23 are bonded together with the adhesive 33, the terminal 272 and the wiring 283 are simultaneously connected with the bump 36.

It is preferable that each of the reservoir forming substrate 24 and the wiring substrate 31 is composed of silicon, and that each of the inclined surface 247 and the inclined surface 311 is formed along a crystal plane of silicon. With this configuration, the inclined surface 247 and the inclined surface 311 can be formed with high dimensional accuracy. As a result, an electrical connection at a desired site (for example, a connection between the wiring 282 and the wiring 283 or a connection between the wiring 283 and the terminal 272) can be made more reliably and easily. Also, a short circuit between unexpected sites (for example, a short circuit between the wiring 281 and the wiring 283) can be prevented, so that the reliability of the wiring structure can be increased.

For example, when a silicon substrate having a surface orientation (100) is wet-etched (anisotropically etched) using an etchant such as KOH or nitric acid to form the inclined surface 247 of the reservoir forming substrate 24 or the inclined surface 311 of the wiring substrate 31, each of the inclined surfaces 247 and 311 can be composed of a (111) plane of silicon. In this case, the inclined surfaces 247 and 311 have an inclination angle of about 54 degrees.

As described above, each of the inclined surfaces 247 and 311 is composed of the crystal plane of silicon, so that the flatness of the inclined surfaces 247 and 311 can be made excellent. Also, the inclination angle of the inclined surfaces 247 and 311 can be set with high accuracy such that the inclined surfaces 247 and 311 are parallel to each other.

The constituent material of the wirings 281, 282, and 283 is not particularly limited, and for example, examples thereof include a metal material such as Al, Ni—Cr, Cu, Ni, Au, or Ag.

The wirings 281, 282, and 283 may have a stacked structure with two or more layers.

The forming method of the wirings 281, 282, and 283 is not particularly limited, and a publicly known deposition method can be used. Moreover, for example, when the wirings 281, 282, and 283 have a stacked structure with two layers, an under layer can be formed by a vapor deposition method such as sputtering, and a plating layer can be formed on the under layer by electroless plating.

The formation of the wirings 281 and 282 may be performed before or after the reservoir forming substrate 24 and the vibrating plate 23 are bonded together with the adhesive 32. However, when the wirings 281 and 282 have a stacked structure with two layers, an under layer can be formed by a vapor deposition method such as sputtering before the reservoir forming substrate 24 and the vibrating plate 23 are bonded together with the adhesive 32, and after the reservoir forming substrate 24 and the vibrating plate 23 are bonded together with the adhesive 32, a plating layer can be formed on the under layer by electroless plating.

When the formation of the wirings 281 and 282 is performed before the reservoir forming substrate 24 and the vibrating plate 23 are bonded together with the adhesive 32, the wiring 281 may be extended to the lower surface of the reservoir forming substrate 24, like the connecting portion 283a of the wiring 283, to be in contact with the terminal 271 or to be connected thereto via a conductive bump.

The formation of the wiring 283 is performed before the wiring substrate 31 and the vibrating plate 23 are bonded together with the adhesive 33.

IC Package

The IC package 9 has a function of driving the plurality of piezoelectric elements 25.

As shown in FIG. 2, the IC package 9 includes an electronic circuit (semiconductor device) 91, a casing (package) 92 that accommodates the electronic circuit 91, and the plurality of terminals 93 that project from the casing 92 and are electrically connected with the electronic circuit 91. The IC package 9 also includes an IC chip (IC chip with connection bump).

The electronic circuit 91 is composed of, for example, semiconductor and includes a driver circuit for driving the piezoelectric elements 25.

The casing 92 has a chip shape or a plate shape and accommodates the electronic circuit 91 therein. The constituent material of the casing 92 is not particularly limited, and for example, examples thereof include various kinds of resin materials, various kinds of metal materials, and ceramics.

The plurality of terminals 93 are electrically connected to the plurality of terminals 27 via the wiring pattern 28.

The plurality of terminals 93 are disposed respectively corresponding to the plurality of terminal portions 281a and 282a (the third terminal and the fourth terminal). Each of the terminals 93 is in contact with the corresponding terminal portion 281a or the corresponding terminal portion 282a. With this configuration, the electronic circuit 91 (the IC package 9) is electrically connected with the plurality of terminal portions 281a and 282a via the terminals 93.

The constituent material of the terminal 93 is not particularly limited, and for example, a metal material having a relatively small electrical resistance such as gold or copper can be used.

The IC package 9 is electrically connected with the piezoelectric elements 25 via the wiring pattern 28.

In the embodiment, the IC package 9 is disposed so as to cover the wiring substrate 31 and the wiring pattern 28 from the upper surface side of the reservoir forming substrate 24. An adhesive 29 fills a space between the IC package 9 and the reservoir forming substrate 24. With this configuration, the IC package 9 can be fixed to the reservoir forming substrate 24, and the wiring pattern 28 can be blocked from the outside for protection. As a result, the corrosion, degradation, or the like of the wiring pattern 28 can be prevented.

The IC package 9 is not limited to the arrangement, size, number, and the like described above, and may be composed of, for example, a pair of IC packages arranged so as to interpose the wiring substrate 31 therebetween in plan view.

According to the droplet discharge head 1 described above, since the plurality of wirings 281 and the plurality of wirings 283 are formed on separate inclined surfaces, each of the pitch between the plurality of wirings 281 and the pitch between the plurality of wirings 283 can be made greater than that between the plurality of terminals 27 (the pitch between the terminal 271 and the terminal 272). Therefore, even when the pitch between the plurality of terminals 27 is reduced, each of the plurality of wirings 281 and the plurality of wirings 283 can be easily formed. As a result, a pitch between the plurality of discharge ports 211 through which droplets are discharged is easily narrowed.

Next, as an example of a droplet discharge apparatus according to the invention, the droplet discharge apparatus 100 including the droplet discharge head 1 will be described.

Figure 6:
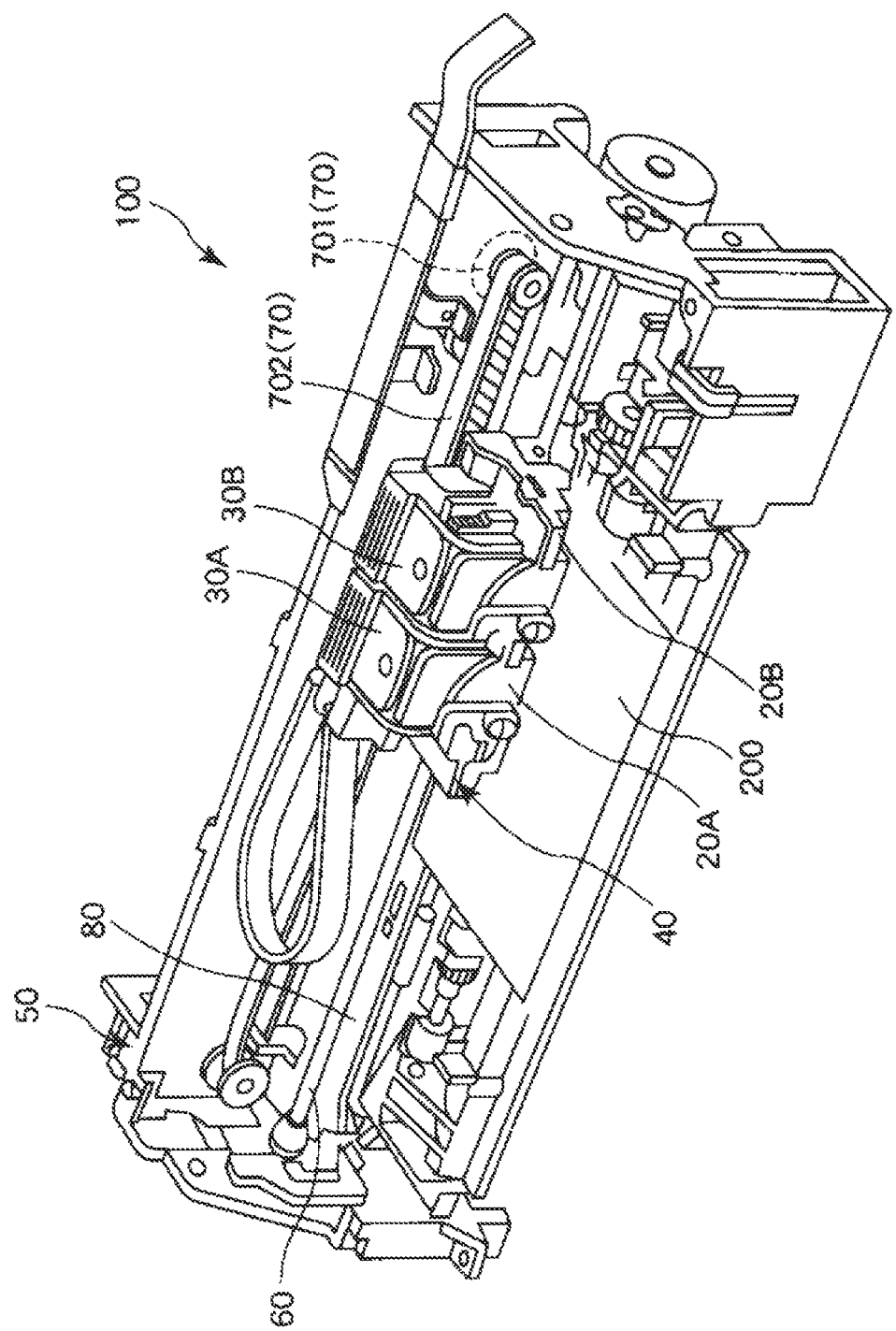
FIG. 6 is a perspective view showing an example of a droplet discharge apparatus according to the invention.

FIG. 6 is a perspective view showing the example of the droplet discharge apparatus according to the invention.

The droplet discharge apparatus 100 (printing apparatus) shown in FIG. 6 is a printing apparatus that performs inkjet printing on a recording medium 200. The droplet discharge apparatus 100 includes an apparatus body 50, recording head units 20A and 20B on which the droplet discharge head 1 is mounted, ink cartridges 30A and 30B that supply the ink 300, a carriage 40 that transports the recording head units 20A and 20B, a moving mechanism 70 that moves the carriage 40, and a carriage axis 60 that movably supports (guides) the carriage 40.

The ink cartridge 30A is detachably attached to the recording head unit 20A and can supply the recording head unit 20A with the ink 300 (black ink composition) in the attached state.

The ink cartridge 30B is detachably attached to the recording head unit 20B and can supply the recording head unit 20B with the ink 300 (color ink composition) in the attached state.

The moving mechanism 70 includes a drive motor 701 and a timing belt 702 coupled to the drive motor 701. The driving force (torque) of the drive motor 701 is transmitted to the carriage 40 via the timing belt 702, so that the carriage 40 can be moved together with the recording head units 20A and 20B along a direction of the carriage axis 60.

In the apparatus body 50, a platen 80 is disposed below the carriage axis 60 along its axial direction. A recording medium 200 fed by a sheet feeding roller (not shown) is transported onto the platen 80. Then, the ink 300 is discharged to the recording medium 200 on the platen 80, so that printing is performed.

According to the droplet discharge apparatus, droplet discharge with high definition can be realized.

The wiring structure, the droplet discharge head, and the droplet discharge apparatus according to the invention have been described so far according to the embodiment shown in the drawings. However, the invention is not limited to this. Each of portions constituting the wiring structure, the droplet discharge head, and the droplet discharge apparatus can be replaced with any configuration capable of providing the same function. Moreover, any configuration may be added.

In the embodiment, an example has been described in which the wiring structure according to the invention is applied to a droplet discharge head. However, the wiring structure according to the invention is not limited to this and can be applied to various kinds of wiring structures as long as the structure includes a plurality of terminals formed on a base substrate and a plurality of wirings formed on a side surface of a wiring substrate bonded to the base substrate in which the plurality of terminals and the plurality of wirings are electrically connected.

In the embodiment, an example has been described in which the droplet discharge apparatus is configured to perform printing by discharging ink as a droplet to a recording medium such as printing paper. However, the droplet discharge apparatus according to the invention is not limited to this. For example, the droplet discharge apparatus according to the invention can discharge as a droplet a liquid crystal display device forming material to manufacture a liquid crystal display device (liquid crystal display apparatus), discharge as a droplet an organic EL forming material to manufacture an organic EL display device (organic EL apparatus), or discharge as a droplet a wiring pattern forming material to form a wiring pattern of an electronic circuit to thereby manufacture a circuit board.

The entire disclosure of Japanese Patent Application No. 2013-014041 filed on Jan. 29, 2013 is expressly incorporated by reference herein.

What is claimed is:

1. A wiring structure comprising:
   a base substrate on which a first terminal and a second terminal are formed;
   a first wiring substrate bonded to the base substrate and including a first inclined surface on which a first wiring electrically connected to the first terminal is formed and that is at an acute angle to the base substrate; and
   a second wiring substrate bonded to the base substrate and including a second inclined surface on which a second wiring electrically connected to the second terminal is formed and that is inclined to the base substrate along the first inclined surface.

2. The wiring structure according to claim 1, wherein
   a third terminal electrically connected to the first wiring and a fourth terminal electrically connected to the second wiring are formed on a surface of the first wiring substrate opposite to the base substrate.

3. The wiring structure according to claim 2, wherein
   the second wiring and the fourth terminal are bonded together via a conductive bump.

4. The wiring structure according to claim 2, wherein
   a plurality of the third terminals and a plurality of the fourth terminals are alternately arranged in parallel.

5. The wiring structure according to claim 2, wherein
   the second wiring extends from the second inclined surface to a surface of the second wiring substrate on the base substrate side.

6. The wiring structure according to claim 5, wherein
   the second wiring and the second terminal are bonded together via a conductive bump.

7. The wiring structure according to claim 1, wherein
   the first inclined surface and the second inclined surface are bonded together via an insulating adhesive.

8. The wiring structure according to claim 1, wherein
   each of the first wiring substrate and the second wiring substrate is bonded to the base substrate via an insulating adhesive.

9. The wiring structure according to claim 1, wherein
   each of the first wiring substrate and the second wiring substrate is composed of silicon, and
   each of the first inclined surface and the second inclined surface is formed along a crystal plane of silicon.

10. A droplet discharge head comprising the wiring structure according to claim 1.

11. A droplet discharge apparatus comprising the droplet discharge head according to claim 10.

* * * * *